(12) United States Patent
Tilton et al.

(10) Patent No.: US 7,299,647 B2
(45) Date of Patent: *Nov. 27, 2007

(54) SPRAY COOLING SYSTEM FOR TRANSVERSE THIN-FILM EVAPORATIVE SPRAY COOLING

(75) Inventors: Donald E. Tilton, Colton, WA (US); Charles L. Tilton, Colton, WA (US); Jeffery K. Weiler, Pullman, WA (US)

(73) Assignee: Isothermal Systems Research, Inc., Liberty Lake, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/241,487

(22) Filed: Sep. 29, 2005

(65) Prior Publication Data

US 2006/0026983 A1    Feb. 9, 2006

Related U.S. Application Data

(63) Continuation of application No. 10/096,340, filed on Mar. 11, 2002, now Pat. No. 6,955,062.

(51) Int. Cl.
*F25D 23/12* (2006.01)
*F25D 5/00* (2006.01)
*H05K 7/20* (2006.01)

(52) U.S. Cl. .......... 62/259.2; 62/310; 62/314; 361/699; 361/695

(58) Field of Classification Search ........ 62/310, 62/314, 259.2, 121, 376, 64; 361/699, 689, 361/691, 695; 239/548, 555; 165/80.4
See application file for complete search history.

(56) References Cited

U.S. PATENT DOCUMENTS

| 5,719,444 | A | 2/1998 | Tilton et al. |
| 5,907,473 | A | 5/1999 | Przilas et al. |
| 5,943,211 | A | 8/1999 | Havey et al. |
| 6,205,799 | B1 * | 3/2001 | Patel et al. .......... 62/132 |
| 6,646,879 | B2 * | 11/2003 | Pautsch .......... 361/699 |
| 6,955,062 | B2 * | 10/2005 | Tilton et al. .......... 62/259.2 |

OTHER PUBLICATIONS

Publication, see attached (1 page).

* cited by examiner

*Primary Examiner*—Chen Wen Jiang
(74) *Attorney, Agent, or Firm*—Wells St. John P.S.

(57) ABSTRACT

A spray cooling system for transverse thin-film evaporative spray cooling in a narrow gap which generally includes a framework, a cooling cavity, a plurality of atomizers oriented to transversely spray coolant across the electronic components to be cooled, and preferably a vapor recirculation system and a reduction in cross section from the inlet or spray side to the exit side.

12 Claims, 7 Drawing Sheets

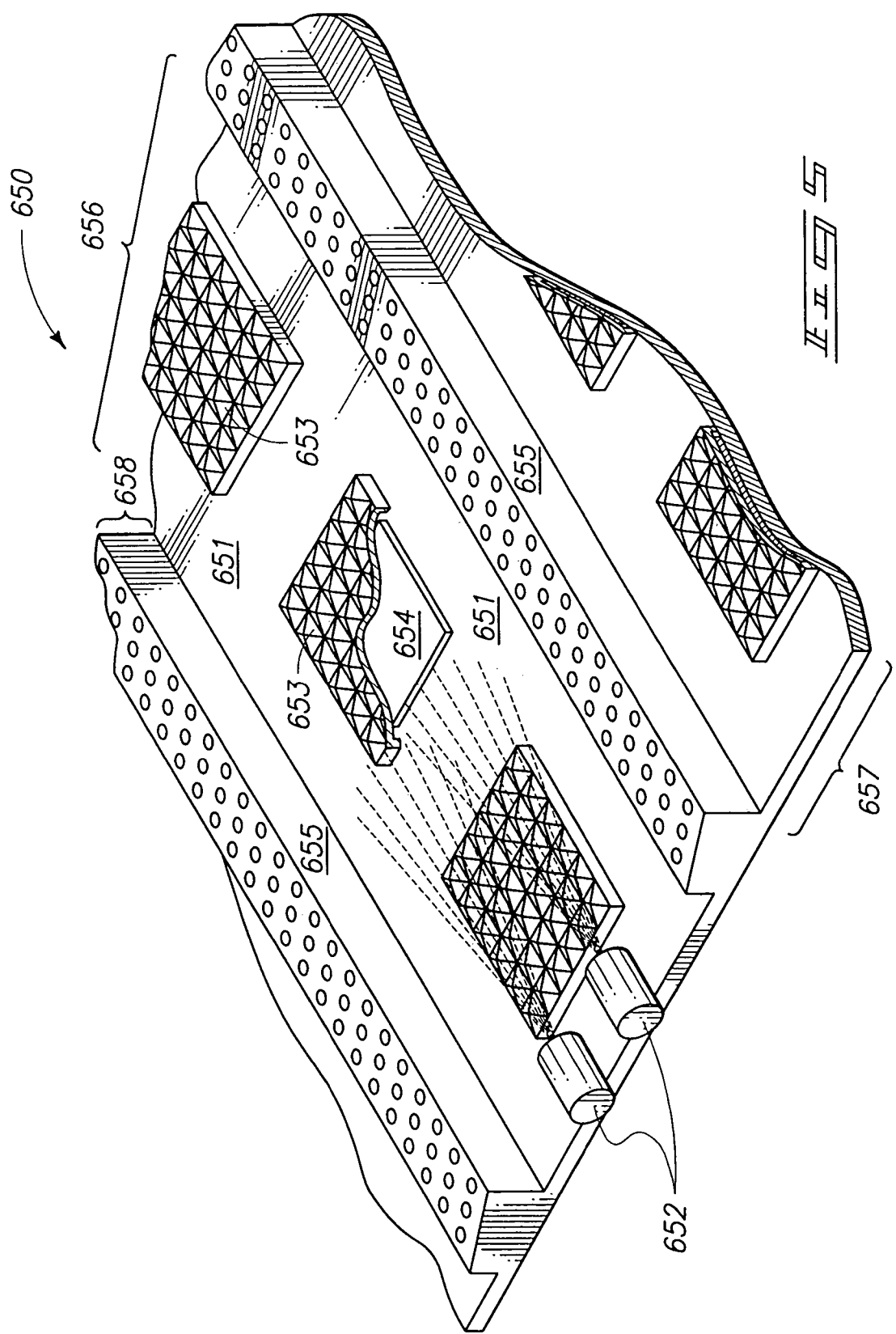

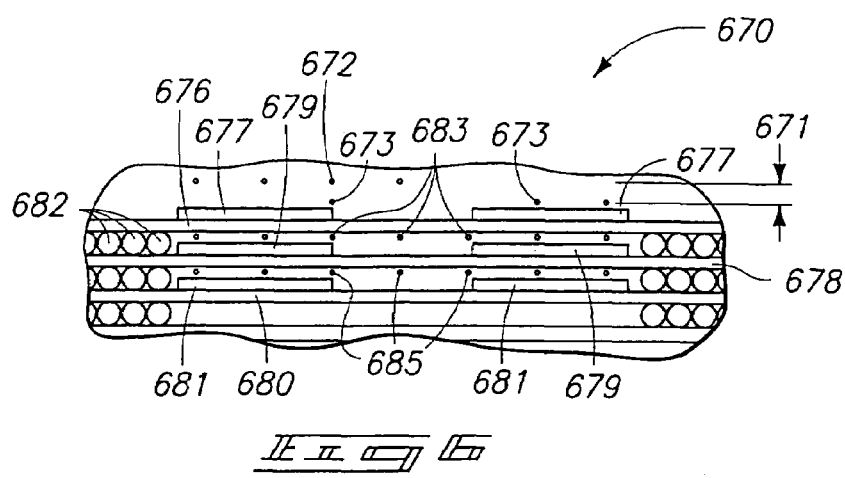
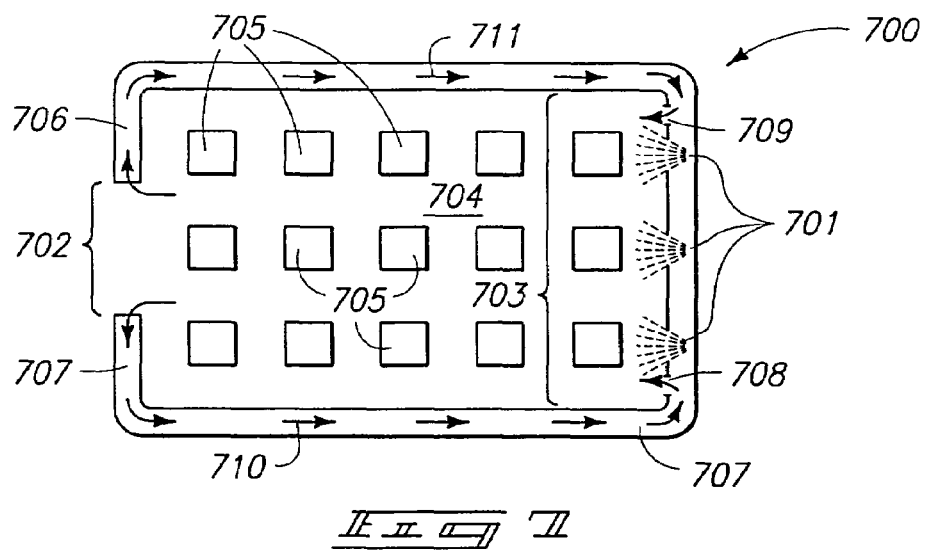
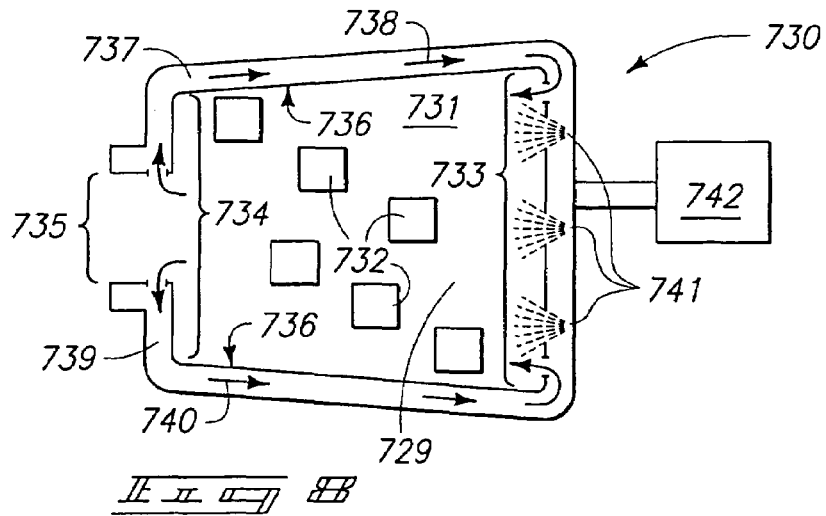

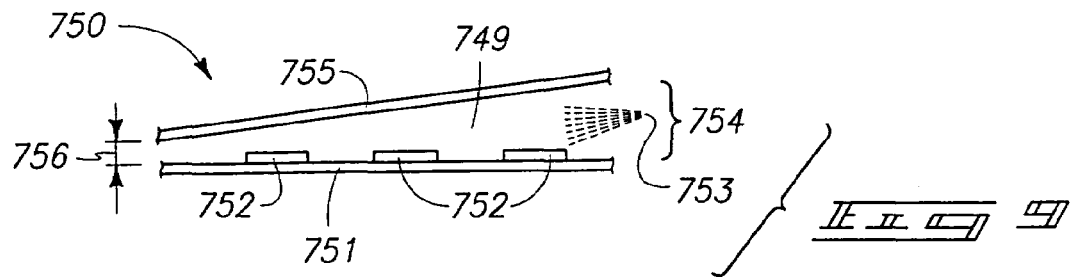
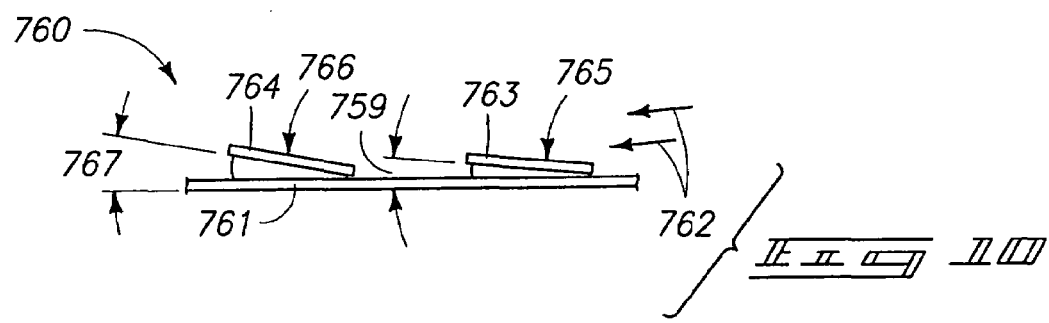
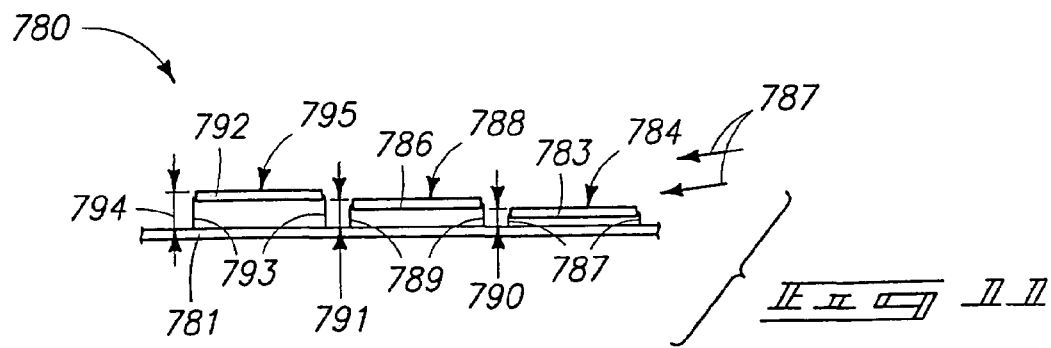

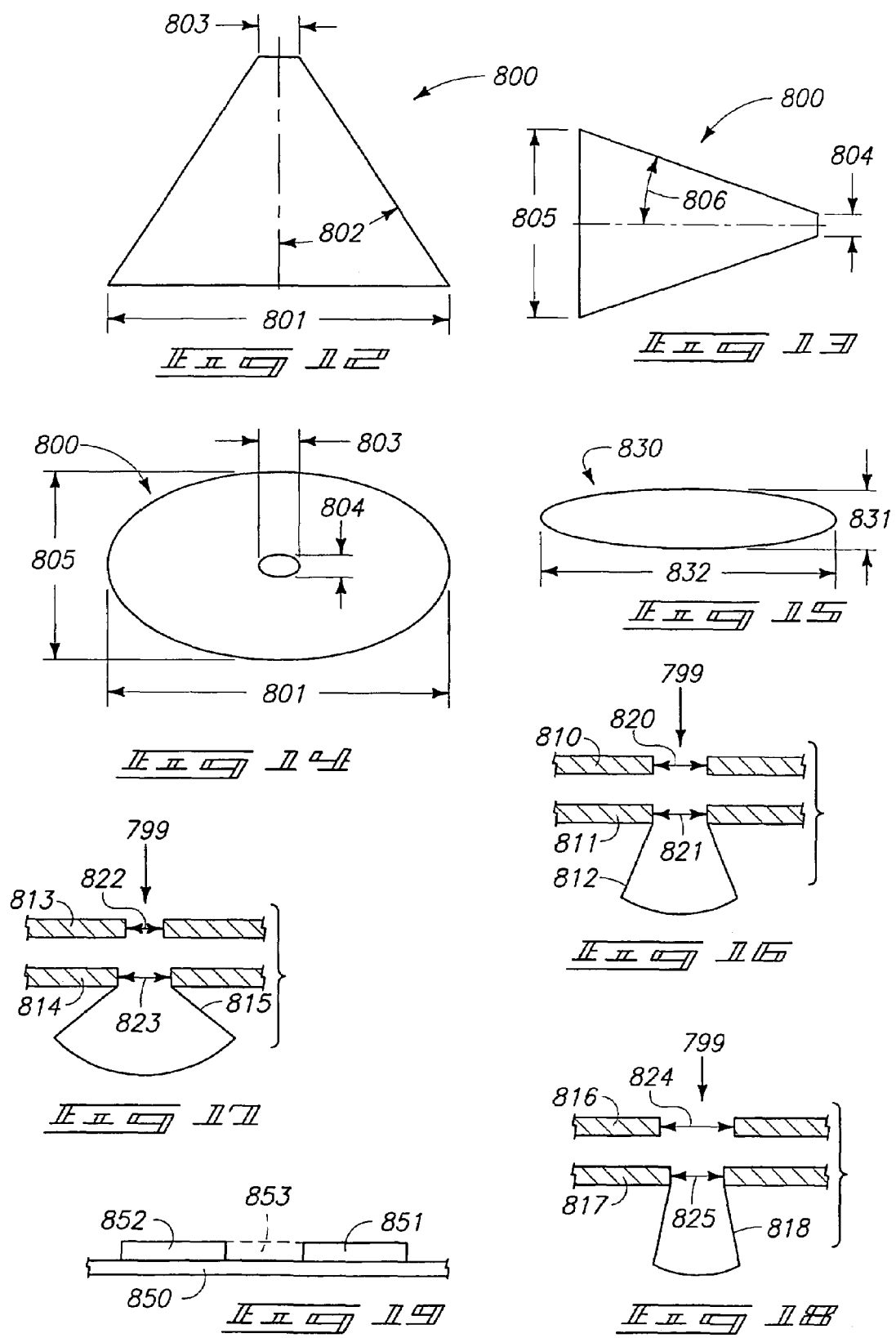

SPRAY COOLING SYSTEM FOR TRANSVERSE THIN-FILM EVAPORATIVE SPRAY COOLING

RELATED PATENT DATA

This is a continuation of U.S. patent application Ser. No. 10/096,340, filed Mar. 11, 2002 now U.S. Pat. No. 6,955,062; and from which this application claims priority.

TECHNICAL FIELD

This invention relates to an evaporative spray cooling system for transverse evaporative thin-film spray cooling of electronic components, in either a single circuit card or stacked circuit card, narrow-gap configuration.

BACKGROUND OF THE INVENTION

As electronic components continue to advance and are made more powerful, they tend to produce more and more undesirable heat which is preferably removed. This has created a growing need for higher capacity cooling systems to remove heat from all or a portion of the electronic components.

As the trend is to make electronic components more powerful, there is also an increasing push to reduce the size of the electronic components, and the packaging of the electronic components. The smaller components and packaging makes the removal of the unwanted heat more difficult.

In some applications, direct impingement thin-film evaporative spray cooling is preferred in order to provide sufficient cooling, whereas in other application spray cooling is desired to reduce the overall package or housing size even though the required cooling capability is not as high. This creates a situation in which transverse narrow gap evaporative spray cooling is advantageous if it can be done to an acceptable efficiency level.

Narrow gap evaporative spray cooling will preferably provide or spray the spray coolant from a transverse side of the electronic components or circuit card, through an atomizer, and thereby transversely spray the coolant or cooling fluid.

Proper cooling is preferably achieved if a thin liquid film is maintained over the device or electronic component to be cooled, thereby facilitating evaporation of the coolant as heat is transferred from the electronic component. If there is too little flow or coverage of coolant, the liquid layer covering the electronic component will dry out and cause the component to overheat because convection will not typically provide sufficient heat transfer. If the flow of coolant to the component is too great, the device will become flooded and may produce hot spots, insufficient cooling and/or failure, because the vapor created from the evaporation may become trapped between the excessive fluid and the impingement surface of the electronic component. This will normally reduce the cooling efficiency. Vapor generated at the surface of the component cannot escape effectively and could result in a boiling heat transfer failure mode generally referred to as burnout.

Even when the volume flux of coolant is properly matched to the heat flux of the device, the excess fluid sprayed within a cavity must be managed by the method described in U.S. Pat. No. 5,220,804 to prevent the overflow from adjacent components from interfering and causing flooding type failure conditions.

It is therefore an objective of this invention to provide a narrow gap, thin-film, evaporative spray cooling system for cooling one or more electronic components in the narrow gap.

BRIEF DESCRIPTION OF THE DRAWINGS

Preferred embodiments of the invention are described below with reference to the following accompanying drawings.

FIG. 3 is a perspective view of one embodiment of a spray cooling system for transverse thin-film evaporative spray cooling with a plurality of circuit cards with electronic components thereon;

FIG. 4 is a perspective breakaway view of an embodiment of a single card transverse thin-film evaporative spray cooling system with a card edge electronic connector;

FIG. 5 is a perspective view of another electronic system which utilizes an embodiment of this invention and may be a component within a three-dimensional electronic cooling configuration;

FIG. 7 is a top view schematic representation of an embodiment of a spray cooling system contemplated by this invention, showing a vapor recirculation system;

FIG. 8 is a top schematic representation of another embodiment of this invention which includes a different embodiment of a vapor recirculation system and a vapor utilization system;

FIG. 9 is an elevation view schematic of an embodiment of this invention where the cooling cavity is tapered to provide beneficial cooling effects;

FIG. 10 is an elevation schematic view of an embodiment of this invention wherein the first electronic component to be cooled is angled relative to the circuit card on which it is mounted to provide an impingement angle for predetermined cooling properties and a second electronic component at a greater impingement angle;

FIG. 11 is an elevation schematic representation of an embodiment of this invention in which successive electronic components are mounted to a circuit card in a stepped configuration;

FIG. 12 is a schematic depiction of a first dimension of a spray pattern or cone which may be generated in an embodiment of this invention by an atomizer for a narrow gap application;

FIG. 13 is a side view of the spray pattern illustrated in FIG. 12 and shows a second and different dimension of the spray pattern;

FIG. 14 is a schematic representation of an approximate spray pattern generated by the spray pattern configuration dimensions shown in FIGS. 12 and 13;

FIG. 15 is another schematic representation of another of the numerous possible two-dimensional spray pattern configurations that may be utilized as part of this invention;

FIG. 16 is a schematic representation of a spray pattern created by relative sizing of layers at the atomization nozzle, showing an approximate angle of 30 to 45 degrees;

FIG. 17 is a schematic representation of a spray pattern created by relative sizing of layers at the atomization nozzle, showing an approximate angle of 45 degrees;

FIG. 18 is a schematic representation of a spray pattern created by relative sizing of layers at the atomization nozzle, showing an approximate angle of less than 30 degrees; and FIG. 19 is an elevation schematic representation of a gap filler inserted between respective electronic components to obtain a more favorable heat transfer.

DETAILED DESCRIPTION OF THE PREFERRED EMBODIMENTS

Many of the fastening, connection, manufacturing and other means and components utilized in this invention are widely known and used in the field of the invention described, and their exact nature or type is not necessary for an understanding and use of the invention by a person skilled in the art or science; therefore, they will not be discussed in significant detail. Furthermore, the various components shown or described herein for any specific application of this invention can be varied or altered as anticipated by this invention and the practice of a specific application or embodiment of any element may already be widely known or used in the art or by persons skilled in the art or science; therefore, each will not be discussed in significant detail.

The terms "a", "an", and "the" as used in the claims herein are used in conformance with long-standing claim drafting practice and not in a limiting way. Unless specifically set forth herein, the terms "a", "an", and "the" are not limited to one of such elements, but instead mean "at least one".

Applicant hereby refers to and incorporates by this reference the following U.S. patents: U.S. Pat. No. 5,675,473 issued Oct. 7, 1997; U.S. Pat. No. 5,220,804 for a high heat flux evaporative spray cooling system; and U.S. Pat. No. 5,860,602 and U.S. Pat. No. 6,016,969, each for a laminated array of pressure swirl atomizers. The laminated array of pressure swirl atomizer patents referred to above may be utilized as one way or mechanism to accomplish the atomizing, even though there are numerous others which are available and now known in the art, such as button atomizers and others.

Figure 1:
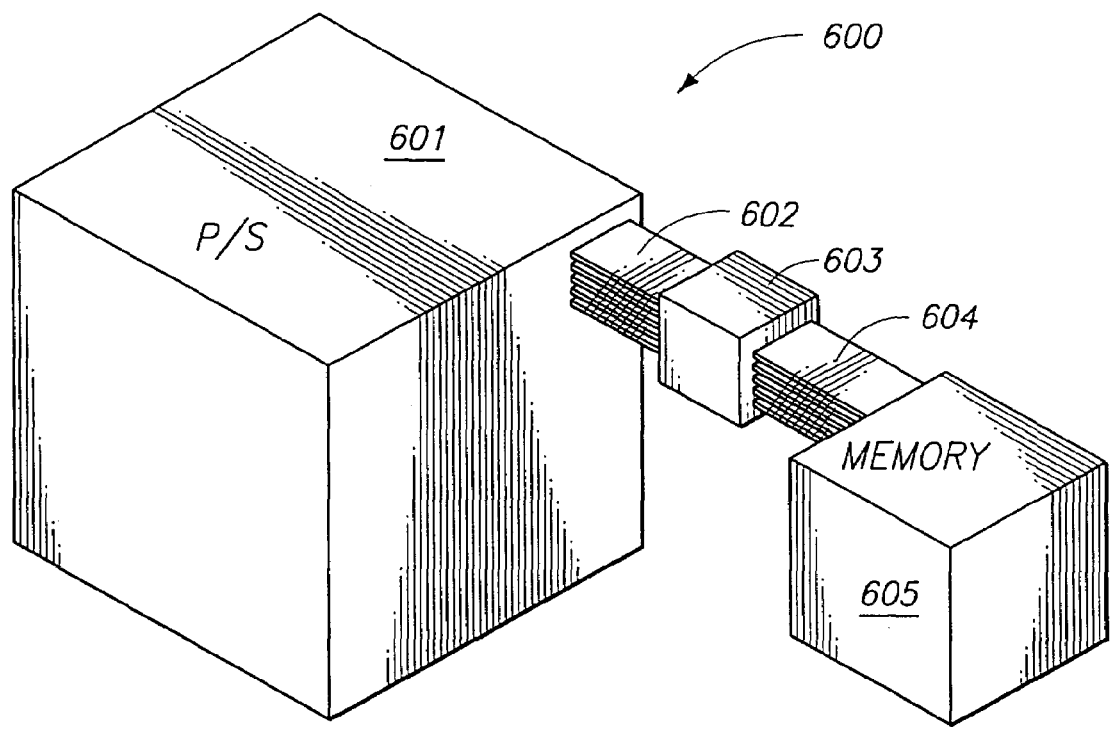
FIG. 1 is a perspective schematic of a prior art configuration and traditional way of providing cooling for various components of a system.

FIG. 1 is a perspective schematic representation of a prior art system 600 showing power supply 601, ribbon connector 602, memory section 605 with ribbon connector 604, and processor 603.

Figure 2:
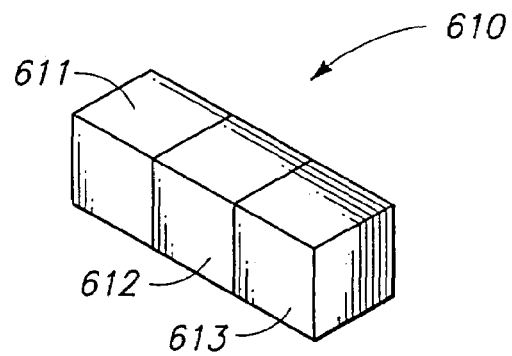
FIG. 2 is a perspective schematic representation of a much more compact version of a system with the same capabilities as that in FIG. 1, only which utilizes features or embodiments of the invention.

FIG. 2 is a preferred size and packaging configuration as provided by embodiments of this invention, and illustrates a reduced size that may be accomplished by an integrated spray cooling system as contemplated by this invention. FIG. 2 illustrates the computer system 610, including a power supply 611, a processor 612 and a memory 613, in a cube configuration. For relative sizing comparison purposes, each of the cubes in FIG. 2 may be approximately 4 inches per side, whereas the components in FIG. 1 would be much larger. For instance the memory 605 in FIG. 1 would be approximately 8 inches square, the processor 603 would be approximately 4 inches square, and the power supply 601 would be approximately 30 inches square.

It will be appreciated by those of ordinary skill in the art this spacing savings by integrating a spray cooled approach to all three components. The configurations shown in FIGS. 1 and 2 are generally referred to as cube computers, and the configuration in FIG. 2 on an integrated platform may be at five times reduction in sizing with the current cube computer configurations as shown in FIG. 1.

FIG. 3 is a perspective breakaway view of another utilization of an embodiment of this invention wherein transverse evaporative thin-film spray cooling is utilized in narrow gaps to cool electronic components on circuit cards which are stacked in close configuration. FIG. 3 illustrates the cooling system 620 with housing 621, a first circuit card 622 with electronic components 623 mounted thereon. Coolant atomizer 624 provides coolant spray transverse to the electronic components to provide a predetermined amount of cooling in the narrow gap cooling cavity or channel. Second circuit card 625 with electronic components 626 is at a level lower than first circuit card 622 and atomization nozzles 627 provide transverse evaporative spray cooling to the electronic components 626 on the second circuit card 625. The system 620 has a plurality of layers of cooled circuit cards and electronic components as represented by item 621. Since the system 620 shown in FIG. 3 is a closed system, reservoir 631 is provided for the cooling fluid and fans 630 provide cooler air for a condenser provided therein. While an air cooled condenser is shown, the invention is not limited to this type of condenser, but instead other types of refrigeration and other condenser systems may be utilized within the scope of the invention.

Generally, narrow gap cooling cavities are a reference to the height of the channel, in the approximate range of 0.020 to 0.125 inches in height (from the top surface of the circuit card to the ceiling surface of the cavity lid or opposing side). The width of the channel or cooling cavity is generally much greater than the height, but wider channels can simply be accommodated with more atomizers along the width. The length of the cooling cavity or channel may be as long as fifteen to twenty inches, although it may also be much shorter, in the range of one inch. In narrow gap spray cooling applications, as discussed more fully below, the use of vapor at the spray side of the cooling cavity is beneficial in the cooling characteristics in the entire channel or cavity, whether the vapor has been recirculated or developed through other techniques, as described more fully below.

For purposes of this invention, the transverse spray cooling generally requires pumps (preferably positive displacement pumps) to provide the liquid coolant to the atomizers, a return system to direct the fluid to a reservoir, a condenser to condense the vapor and vapor/liquid mixture to a liquid form.

FIG. 4 is a perspective cutaway view of a single circuit card application or embodiment of this invention, illustrating a closed transverse evaporative spray cooling system 640 with housing 644, fluid inlet 643, fluid outlet 642, a plurality of electronic components 645 mounted on circuit card 647, or printed circuit board, a plurality of liquid atomizers 646 providing atomized liquid coolant to the electronic components 645 being cooled. The cooling cavity 649 is generally enclosed by housing 644, and in this case is a narrow gap configuration with the electronic components 645 having an electrical connector 647 configuration as a card edge connector.

It will be appreciated by those of ordinary skill in the art that the number of possible applications of this invention are numerous and each of the individual components may have numerous types or configurations which may be utilized all within the contemplation of this invention. For instance, there are numerous types of electrical connectors that can be made or utilized to provide electrical connections between the electronic components 645, the circuit card 647, and the card edge connector 641.

FIG. 5 is a perspective view of another embodiment of a transverse spray cooled evaporative thin-film cooling system contemplated by this invention, illustrating circuit card 651, atomizers 652, fuzz button connector 655 for interconnecting circuit card 651 with others stacked above or below it, electronic component 654 with heat spreader 653 mounted thereon, and to provide improved heat transfer characteristics between the coolant received from atomizers 652 and electronic components 654. The coolant cavity 656 is a predetermined width, height 658 (preferably narrow gap) and length from the spray side (near the atomizers) to the exit side.

It will be appreciated by those of ordinary skill in the art that there are numerous narrow gap configurations in which electronic components mounted on circuit boards need to be cooled, and the system 650 illustrated in FIG. 5 is merely one of numerous examples thereof, with no particular configuration being required to practice this invention.

Figure 6:
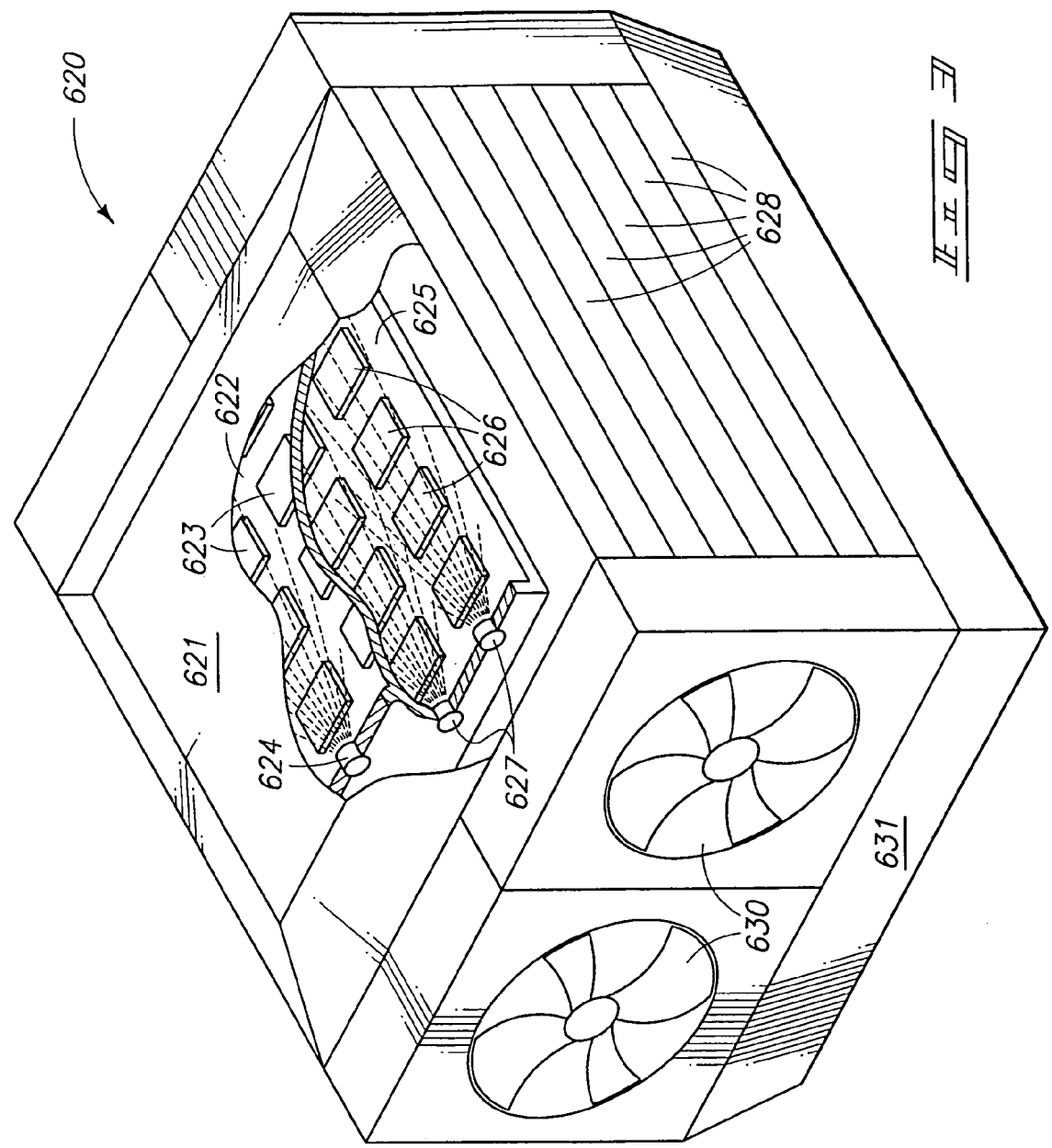
FIG. 6 is an end view of stacked circuit cards, each with electronic components and configured for transverse evaporative spray cooling.
Figure 6:
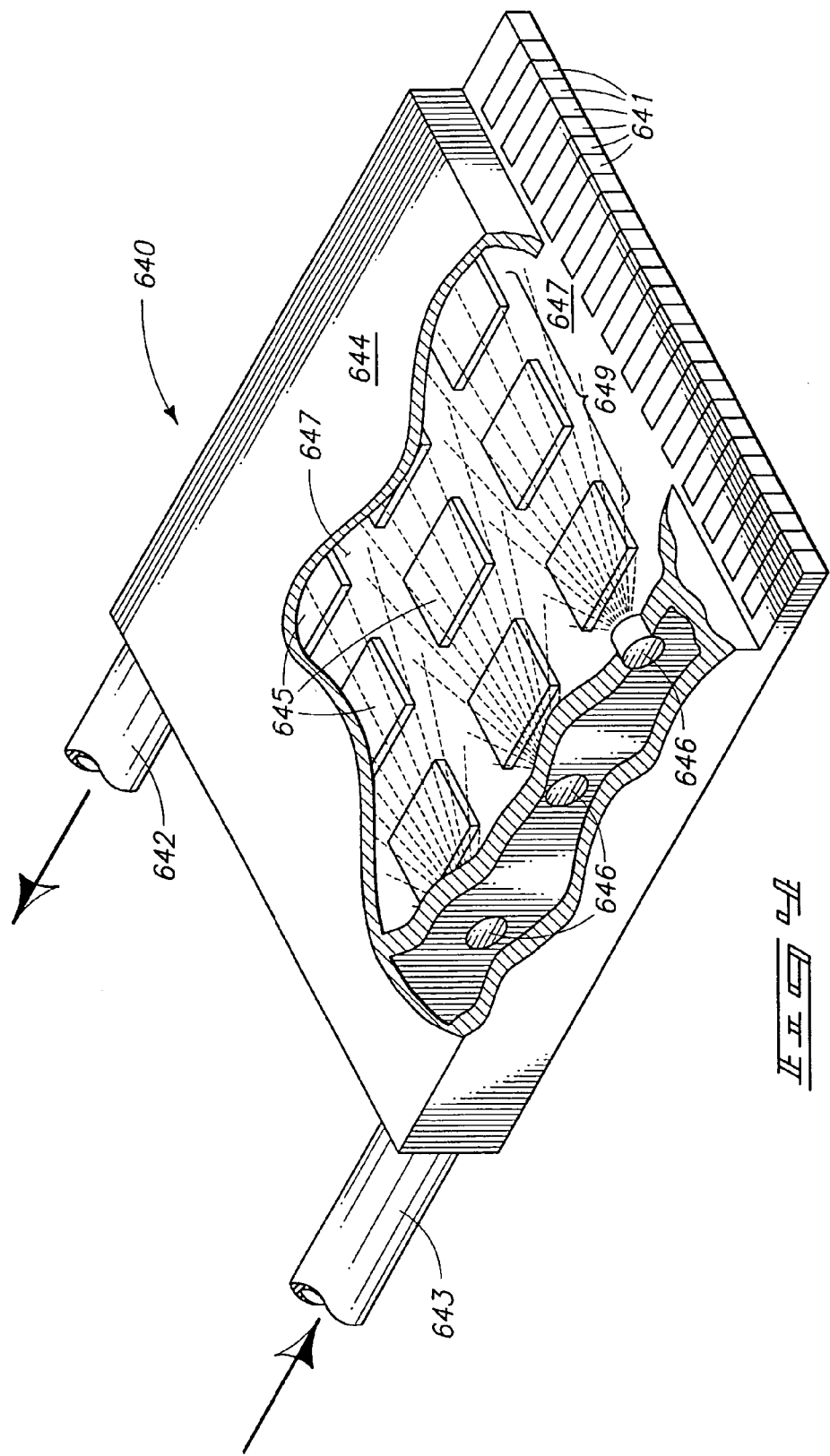

FIG. 6 is an end view looking from the exit side to the spray side of a three-dimensional or stacked transverse evaporative spray cooling system 670. The stacking creates multiple narrow gaps. FIG. 6 illustrates a first circuit card 676 with electronic components 677 mounted thereon and a first plurality of atomizers 673 for providing spray coolant to the first electronic components 677. Second circuit card 678 has electronic components 679 mounted thereto and a second plurality of atomizers 683 providing spray coolant through the narrow gap and to the electronic components 679. The first circuit card 676 is interconnected with the second circuit card 678 by known board-to-board interconnects 682. Although this type of interconnection is utilized in this invention, as will be appreciated by those of ordinary skill in the art, numerous others are available and no one in particular is required to practice this invention.

FIG. 6 further shows third circuit card 680 with electronic components 681 mounted thereon and a third plurality of atomizers 685 providing spray cooling through the narrow gap to the electronic components 681.

The evaporative spray cooling atomizers are providing the spray fluid transversely, i.e. from the side of the electronic components.

FIG. 6 also shows another embodiment or feature of the invention wherein the plurality of atomizers is vertically staggered with respect to one another to provide the predetermined cooling characteristic for the electronic components being cooled. FIG. 6 illustrates the first plurality of atomizers has vertically higher atomizers 672 which are staggered from the other atomizers by vertical offset 671. There may be many instances in which it is desirable to achieve different flow characteristics by elevating some atomizers relative to others within a plurality.

There are also benefits, flow characteristics and cooling characteristics which may be achieved by slightly angling the normal angular configuration of the atomizer. Typically in a laminated atomizer situation, the atomizers spray coolant at approximately perpendicular to the surface from which the atomizers are spraying (approximately parallel to the circuit card). However, relative to the spray pattern and the circuit card, the atomizers may preferably be angled at an approximate three (3) to five (5) degree angle (normally measured from the center line of the spray pattern) and elevated for improved cooling characteristics on the electronic components being cooled within the cooling cavity.

FIG. 7 is a top schematic view of an embodiment of a transverse evaporative spray cooling system for thin-film cooling of electronic components and further illustrates a configuration for one embodiment of a vapor recirculation system in connection with a narrow gap cooling cavity or channel. FIG. 7 illustrates a transverse evaporative spray cooling system 700 with an internal cooling cavity 703, a plurality of spray cooling atomizers 701, a plurality of electronic components 705 mounted on circuit card 704, or printed circuit board, an exit 702 and a first vapor recirculation conduit 706 in which vapor 711 is recirculated to vapor re-entry port 709. FIG. 7 further illustrates a second recirculation conduit 707 with vapor 710 routed therethrough for introduction back into the cooling cavity through vapor port 708.

It should also be noted that it is generally preferably to have a relief area, slot, etc. where the coolant may be received near the exit side of the cooling cavity to that the fluid does not collect and tend to backup, thereby causing pooling or impeding the thin film evaporative cooling occurring. This allows the combination of the coolant and the vapor to maintain thin film flow and evaporation. The relief area need not be in any one location and may vary with the orientation of the spraying, such as upward, downward, horizontally, or any combination thereof.

FIG. 8 is a top schematic representation of another embodiment of the transverse evaporative spray cooling system 730 contemplated by this invention. FIG. 8 illustrates a cooling cavity 729 with a spray side 733 and an exit side 734, the exit side being nearer the exit 735 than the spray side. A plurality of atomizers 741 provides coolant to the cooling cavity 729 to cool electronic components 732 mounted on circuit card 731. The system 730 illustrated in FIG. 8 further shows a first vapor recirculation conduit 737 routing vapor 738 through the conduit and reintroducing it at or near the spray side 733 of the cooling cavity 729. Similarly, vapor recirculation conduit 739 routes vapor 740 for reintroduction into the cooling cavity nearer the spray side 733 of the cooling cavity 729.

It should be noted that the electronic components 732 have been staggered relative to one another in the stream of movement of cooling fluid and vapor. The electronic components 732 have been positioned in predetermined locations to avoid any blockage or impingement of spray cooling from a first electronic component nearer the spray side 733 of the cooling cavity 729 for a downstream electronic component near the exit side.

FIG. 8 also illustrates another embodiment of this invention wherein the cooling cavity 729 is tapered from the spray side 733 to the exit side 734 via sidewall 736 configuration. In many applications, embodiments of this invention which provide decreasing cross-sectional area from the spray side 733 to the exit side 734 create beneficial flow characteristics and acceleration of vapor in the system, to provide better or more desirable cooling, especially for electronic components nearer the exit side 734 of the cooling cavity 729. The tapering need not be any particular percentage reduction, but a tapering to approximately one-half of the cross-sectional area from the spray side of the cavity to the exit side is one that is used and seems to work.

FIG. 8 further shows a heat exchanger system 742 which pre-heats the cooling fluid or coolant before it is provided to the atomizers. The heat exchanger or pre-heater is sometimes referred to as a cold plate. When the coolant is pre-heated to above its normal boiling temperature (it is generally under pressure) and is then atomized through the atomizer nozzles, the additional energy or heat in the fluid from being above its normal boiling temperature is released and the fluid is partially vaporized until the coolant gets down to its approximate normal atmospheric boiling temperature. Providing vapor through pre-heating provides additional flow control and helps reduce or prevent the eddies from detracting from the flow and the heat transfer.

FIG. 9 is an elevation schematic representation of another embodiment of this invention in which the cooling cavity 749 has a decreasing cross-sectional area from the spray side to the exit side thereof. The cooling cavity lid 755 is angled downwardly toward the exit side of the cooling cavity, with the distance from the circuit card 751 to the cavity lid 755 at the spray side is distance 754, whereas the distance between the circuit card 751 and the lid 755 at the exit side is distance 756, wherein spray side distance 754 is greater than exit side distance 756. Electronic components 752 are mounted on the circuit card 751 in the system 750 illustrated in FIG. 9.

FIG. 10 is an elevation schematic representation of another embodiment of the invention which is utilized to obtain predetermined cooling characteristics and illustrates an impingement surface angling system 760 wherein the electronic components are mounted at an impingement angle relative to the circuit card to obtain different flow characteristics. FIG. 10 further illustrates in schematic fashion an electronic component nearer the exit side of the cooling cavity being at a greater impingement angle than an electronic component upstream nearer the spray side of the cooling cavity, for predetermined desired relative cooling effects.

FIG. 10 illustrates a cooling system 760 which utilizes the respective angles of the impingement surfaces of the respective electronic components 763 and 764, with flow arrow 762 indicating the direction of flow of the atomized spray cooling fluid for cooling. FIG. 10 illustrates circuit card 761 with first electronic component 763 mounted at impingement angle 759 relative to circuit card 761. The impingement surface 765 of first electronic component 763 is shown, and the impingement angle is achieved by mounting the spray side of electronic component 763 of a height less than the exit side of first electronic component 763. Impingement angle 759 is shown for first electronic component 763. While this invention contemplates the angling of one electronic component, it also contemplates one or more electronic components being angled and additional desirable characteristics which may be achieved by providing a greater impingement angle for downstream electronic components being cooled. FIG. 10 shows second electronic component 764 with impingement surface 766 mounted at impingement angle 767 relative to circuit card 761.

It has been discovered that greater heat transfer or cooling characteristics may be achieved by varying the angle of impingement or the angle at which a surface to be cooled is impacted by spray droplets. There can be an appreciable difference between cooling characteristics of electronic components when the spray droplets impact perpendicular to the surface versus hitting it at an angle less than ninety degrees. The embodiment illustrated in FIG. 10 utilizes those characteristics to provide an optimized cooling system and cooling for the electronic components mounted toward the exit side of the cooling cavity.

FIG. 11 is an elevation schematic representation of another embodiment of this invention in which the mounting of the electronic components is altered from normal practice to achieve more desirable cooling characteristics. FIG. 11 illustrates a transverse evaporative spray cooling system 780 in which the respective electronic components are mounted in a stepped or varying height manner from the spray side of the cooling cavity to the exit side. The spray side of the cooling cavity in the schematic representation would be near the flow arrow 787 (which indicates the direction which the spray coolant is traveling).

FIG. 11 illustrates circuit card 781 with first electronic component 783 mounted thereon via pins 787 and with impingement surface 784. The height of impingement surface 784 relative to the top surface of circuit card 781 is distance 790. Second electronic component 786 with impingement surface 788 is mounted by pins 789 at impingement surface height 791. Please note that distance 791 from the top surface of circuit card 781 to the impingement surface 788 is greater than distance 790 for the first electronic component 783. The first electronic component 783 is nearer the spray side of circuit card 781 than second component 786.

Further shown in FIG. 11 is third electronic component 792 with impingement surface 795, third electronic component 792 being mounted by pins 793 at height 794 from the top surface of circuit card 781. It will be observed that third electronic component 792 has an impingement surface 795, at a greater height relative to circuit card 781 than both the second electronic component 786 and the first electronic component 783.

The stepping or staggering of the heights of the impingement surfaces of the respective electronic components may be utilized to achieve improved cooling characteristics, especially of downstream electronic components nearer the exit side.

FIG. 12 illustrates a front elevation view of one of numerous potential spray patterns or cones 800 which may be utilized as part of this invention, illustrating first dimension 803, second dimension 801 and cone angle 802. Because the spray is projected into a narrow gap cavity, it is preferred that the spray pattern not be a circular cone but instead it be more elliptical or it be configured such that a first dimension corresponding to the width of the narrow gap or cooling cavity be much greater than a second dimension corresponding to the height of the narrow gap cooling cavity. If a circular cone shape spray pattern is utilized in narrow gap evaporative spray cooling, it will likely result in a larger than desired amount of coolant spray reaching the electronic components near the inlet or atomizers, and a less than desired amount of coolant reaching the exit side components, which would result in the required coolant flow to cool all of the electronic components being unnecessarily high. Further, an undesirable amount of coolant would strike the lid and be wasted.

FIG. 13 is a side elevation view of the spray pattern 800 shown in FIG. 12, illustrating second inlet dimension 804, third cone dimension 805 and second dimension cone angle 806. While the dimension at any given location on the spray pattern will vary with the distance from the nozzle outlet, the dimensional angle will dictate the spray pattern in a given situation. In the embodiment of the invention illustrated in FIGS. 12-14, the second dimension angle 806 is less than the first dimension angle 802 and provides an approximate elliptical pattern which may be adapted or optimized to a particular narrow gap cooling cavity configuration.

FIG. 14 is a top view of the spray pattern illustrated in FIGS. 12 and 13, showing second inlet dimension 804, first inlet dimension 803, first spray pattern dimension 801 and second spray pattern dimension 805. The spray pattern 800 illustrated in FIG. 14 is merely an example, and there are numerous different shapes and relative sizing of first and second dimensions that may be utilized in connection with this invention, as illustrated below in reference to FIG. 15.

FIG. 15 is a top view of another spray pattern which may be utilized in a thinner gap configuration than that shown in FIGS. 12-14 and illustrates an elliptical pattern with a first cone dimension 832 and a second cone dimension 831 for spray pattern 830.

While there may be numerous mechanical and other geometrical configuration ways to accomplish various spray patterns and dimension angles for spray patterns, FIG. 16 illustrates first plate 810 with a nozzle aperture distance 820, second plate 811 with nozzle aperture distance 821 and spray pattern 812 generated by coolant 799 flowing through the respective apertures.

It will be appreciated by those in the art that laminated plates or layers relatively configured will cause different spray patterns and spray pattern dimension angles to achieve the desired results. In FIG. 16, the apertures in the dimensions shown in plate 810 and plate 811 creating approximately thirty (30) to forty-five (45) degree spray pattern angle in the dimension or direction shown.

FIG. 17 shows an alternative embodiment configuration of spray plates wherein the first spray plate 813 has first aperture dimension 822 less than the aperture dimension 823 and second spray plate 814. The aperture distance 823 is greater than the aperture distance 822 and thereby creates a larger spray pattern 815 dimension angle, as shown in the figure at approximately forty-five (45) degrees or more. This may be the respective dimensions corresponding to the width of the cooling cavity as opposed to the height.

FIG. 18 is another alternative embodiment configuration of nozzle apertures, showing first spray plate 816 with an aperture distance 824 larger than the aperture distance 825 in second spray plate 817, thereby creating a smaller spray pattern dimension angle of the spray pattern 818, the angle being shown at approximately thirty (30) degrees or less. This configuration in this dimension may be more appropriately used corresponding to the height of the narrow gap cooling cavity.

In another embodiment of the invention and in order to improve flow characteristics, flow predictability, and cooling performance in a thin film evaporative spray cooling environment, backfill material or gap levelers may be placed on the circuit board between electronic components, or relative to the impingement surfaces of the electronic components. FIG. 19 is an elevation schematic representation of such an embodiment, illustrating circuit card 850, first electronic component 851, second electronic component 852, and gap filler 853. The gap filler 853 can be any one of a number of different types of materials, such as potting material, pre-fabricated material or templates for insertion between electronic components, or others, all within the contemplation of this invention.

In embodiments of this invention, it is desired at times to obtain a more uniform coverage of coolant on the electronic components. During the normal course of cooling, without other design features included, most or all of the vapor generated during the cooling process from the evaporation, and all of the unused liquid, generally exit the system. In many cases and configurations however, the spraying of coolant from the atomizers is an effective vapor pump and creates a low pressure zone in or near the inlet area, as compared to the pressure zone at the outlet area. This may be referred to as an adverse pressure gradient.

Since fluid, including vapor, tends to flow from high pressure to low pressure and high pressure tends to develop toward the exit area, conflict develops and eddies tend to develop in the corners near the inlet or spray atomizers as the vapor tends to move back toward the low pressure area or zones at or near the atomizers or spray coolant inlet, which is the spray side or the entrance side of the circuit card or cavity in which the electronic components are housed or contained. Interfacial drag of vapor and/or liquid and thin liquid creates a drag or pull on the liquid which is on the impingement surface or surface of the electronic components. When the eddies described above occur and sometimes increase in strength, they have the potential to completely block off or alter the spray pattern originally obtained and desired. This causes alterations to the heat transfer, thin-film evaporation and the cooling capacity of the spray cooling system. This condition results in more spray coolant being provided to the electronic components nearer the spray side and less or inadequate coolant being supplied to the electronic components nearer the exit side, and some electronic components not getting any or sufficient coolant.

In order to reduce or eliminate this problem, this invention utilizes a "vapor recirculation" system. Vapor recirculation within the contemplation of this invention may be utilized in any one of a number of different ways. One way is to provide an opening or openings near the exit side of the circuit card or cooling cavity, the apertures or openings being configured to allow vapor to flow there-through while also preferably impeding the flow of liquid.

One of several ways to help keep the liquid out or reduce the liquid which enters the exit vapor openings, is to provide the openings with a large enough cross-sectional area that the entering vapor has a low velocity and does not entrain liquid or draw the liquid into the openings. It is also preferable, although not necessary to practice this invention, that the openings are at least initially near perpendicular or more to the direction of travel of the liquid or even in the opposite direction of the liquid, as liquid does not tend to turn as easily as vapor when flowing. While it would be very difficult to prevent nominal amounts of spray coolant liquid to become entrained, additional precautions may be taken to avoid re-introducing non-atomized liquid.

As shown in FIGS. 7 and 8, the vapor is routed back toward the spray or inlet side where it is introduced through one or more apertures or openings, and thereby provides a vapor velocity to partially or wholly prevent the eddying or backflow effect. If the vapor recirculation conduits are large enough in cross-section, the vapor velocity is reduced and it tends not to draw or entrain as much liquid back toward the inlet area where the vapor is being redirected. In this case no shroud is used to control the fluid but instead the vapor in the system is partially gathered and routed back to or toward the entrance side or the spray side of the cooling cavity or circuit card.

An alternative vapor recirculation system may involve sizing the cooling cavity sufficiently wide that the vapor can be recirculated at the far sides of such a wider cavity at a low enough velocity within the side channels so that liquid would not be entrained and eddies would not develop. This is not preferable in applications in which size constraints are more important, and this type of vapor recirculation system may tend to lower heat transfer coefficients. In a narrower channel application of the vapor recirculation system, the higher vapor velocities assist in spreading the cooling liquid or coolant and in thinning or reducing the depth of the liquid film over the electronic components, especially toward the exit side of the cooling cavity or chamber.

It will be appreciated by those of ordinary skill in the art that the specific velocities and thickness of coolant or liquid being evaporated varies from application to application and no one in particular is required to practice this invention.

Another one of the potential vapor recirculation systems which may be utilized within the contemplation of this invention is to materially increase the amount of coolant that is sprayed and to widen the array of atomizers which provide the atomized coolant to the cooling cavity. This would have the effect of impinging heavily on the entire circuit card and electronic components mounted thereon, on all of the channel surfaces and, in effect, overpowering the vapor trying to backflow or eddy. This embodiment is not preferred in many applications because it requires a substantially higher flow rate of coolant. Further if one atomizer becomes weak or inoperative, it will cause a failure of a system because a lower pressure region would then be created where the atomizer failure occurred.

The typical and preferred coolant utilized with spray in this invention is fluorinert™, available from 3M. However, this invention is in no way limited to any one particular coolant, as there are many others which may be suitable dielectric coolants, such coolants known and available in the industry.

Although the invention is certainly not limited to any particular range for cooling, under current practice in cooling, the following method is utilized to design an apparatus according to the present invention. First, the individual circuit cards are analyzed according to the individual device size, power distribution and layout to determine the most desirable spray configuration. Based upon the maximum device heat flux of the individual components, geometry constraints, and the total board power level and size, the narrow or transverse spray, angled impingement, or normal impingement spray configuration is chosen. The following table serves as a general guideline for spray cooling with perfluorcarbons.

| Configuration | Max. Device Flux | Avg. Board Flux | z-axis space |
|---|---|---|---|
| Narrow Gap | 20 W/cm$^2$ | 20 W/cm$^2$ | 0.02"–0.25" |
| Angled Impingement | 40 W/cm$^2$ | 30 W/cm$^2$ | 0.25"–0.375" |
| Normal Impingement | 150 W/cm$^2$ | 50 W/cm$^2$ | 0.25"–0.75" |
| Enhanced Surface | 1.5–10.0 × Normal | 1.5–10.0 × Normal | 0.25"–1.0" |

There are other possible embodiments to this invention which may have benefits such as cost reduction, elimination of diamond processing, and improvement of the performance potential, although none of these are required to practice the core invention disclosed herein. Recent cooling studies concerning spray cooling in narrow gaps suggests that a higher performance approach is possible by actually spraying through the computer, rather than relying on costly thick diamond to conduct the heat to the edge. Experiments demonstrate the ability to remove five hundred (500) Watts per board while accommodating the required board pitch.

FIG. 5 shows an embodiment of the invention with this modified MCM Concept. The thick diamond substrates and fuzz button retainer boards are replaced with standard PCB's or ceramic substrates. Thin, rough diamond squares 653 (heat spreaders) slightly bigger than the chips 654 (electronic components) are metallized and attached to the chip backs. The chips 654 are flip tab or flip chip bonded to the standard substrates. The boards are then integrated 3-D using progressive wave tube interconnects or other suitable approaches, thus leaving narrow gaps between boards. A spray plate on one side with flat spray atomizers will direct a droplet mist through the computer and remove the heat from the diamond squares through thin film evaporation. The excess liquid and vapor will be collected on the opposite side of the cube.

Embodiments of the invention may also be integrated with a high density switch mode power supply. The memory module could also be more closely integrated using 3-D memory cubes, such as shown in FIG. 2. The computer, power supply and memory module would all be cooled with "Spray Through Cooling." This integrated approach will reduce the number of interconnections, reduce the signal path to increase clock speed, improve power insertion, and simplify construction to reduce size and cost.

As will be appreciated by those of reasonable skill in the art, there are numerous embodiments to this invention, and variations of elements and components which may be used, all within the scope of this invention.

One embodiment of this invention, for example, is for example a narrow gap thin-film evaporative spray cooling system for cooling at least one electronic component utilizing a transversely sprayed cooling fluid, comprising: a transverse spray framework defining an at least partial perimeter around a narrow gap cavity, the narrow gap cavity including a height, a width greater than the height, and a length, disposed to house at least one electronic component to be spray cooled; a plurality of transverse atomizers integral with the transverse spray framework at a first side of the transverse spray framework, the plurality of transverse atomizers being disposed to receive cooling fluid and to spray the cooling fluid into the narrow gap cavity transverse to the at least one electronic component; and a cooling fluid outlet in fluid communication with the cooling fluid cavity, disposed to receive cooling fluid from the narrow gap cavity and route it to a transverse spray framework outlet.

Additional embodiments to the foregoing, may be: further wherein the plurality of atomizers are configured to spray the cooling fluid into the narrow gap cavity in a spray pattern which includes a first spray pattern angle corresponding to the width of the narrow gap cavity and a second spray pattern angle corresponding to the height of the narrow gap cavity, and further wherein the first spray pattern angle has a predetermined approximate magnitude greater than the second spray angle dimension further comprising: a cooling fluid vapor recirculation system which comprises: a cooling fluid vapor outlet at the downstream side of the narrow gap cavity, the cooling fluid outlet configured to receive cooling fluid vapor from the narrow gap cavity; and a cooling fluid vapor recirculation inlet configured to receive cooling fluid vapor routed through the cooling fluid vapor outlet and disposed to direct said cooling fluid vapor through the narrow gap cavity in the approximate direction of transverse flow of the cooling fluid; further wherein the cooling fluid vapor recirculation system comprises two or more cooling fluid vapor recirculation inlets each configured to receive cooling fluid vapor routed through the cooling fluid vapor outlet and disposed to direct said cooling fluid vapor through the narrow gap cavity in the approximate direction of transverse flow of the cooling fluid; and/or further wherein each of the two or more cooling fluid vapor recirculation inlets are disposed to direct said cooling fluid vapor at a pre-determined introduction angle, and further wherein the pre-determined introduction angles are dissimilar to one another.

In another further embodiment of the invention, the narrow gap thin-film evaporative spray cooling system as recited above is provided, and: further wherein at least one of the plurality of transverse atomizers are oriented at an angle which is approximately three to five degrees downward from parallel to the circuit card; further wherein a cross-sectional area of the narrow gap cavity reduces from the atomizers to the cooling fluid outlet; further wherein a cross-sectional area of the narrow gap cavity reduces from the atomizers to the cooling fluid outlet by at least twenty percent; further wherein a cross-sectional area of the narrow gap cavity reduces from the atomizers to the cooling fluid outlet by at least forty percent; and/or further wherein at least one of the plurality of transverse atomizers is oriented at a first angle and at least one of the plurality of transverse atomizers is oriented at a second angle relative to the circuit card.

In another embodiment of the invention, a narrow gap thin-film evaporative spray cooling system for cooling a plurality of electronic components utilizing a transversely sprayed cooling fluid is provided, comprising: a spray framework with a cooling fluid cavity which includes a cooling fluid inlet; the transverse spray framework defining an at least partial perimeter around a narrow gap cavity, the narrow gap cavity including a height, a width greater than the height, and a length, disposed to house a plurality of electronic components to be spray cooled; a plurality of transverse atomizers integral with the transverse spray framework at a spray side of the transverse spray framework, the plurality of transverse atomizers being disposed to receive cooling fluid, and further disposed to spray the cooling fluid toward the exit side into the narrow gap cavity transverse to the plurality of electronic components; a cooling fluid outlet in fluid communication with the cooling fluid cavity, the cooling fluid outlet being disposed to receive cooling fluid from the narrow gap cavity and route it to a transverse spray framework outlet; and wherein a first electronic component is nearer the spray side of the narrow gap cavity than a second electronic component, and the height of an impingement surface of the first electronic component is less than the height of an impingement surface of the second electronic component by a pre-determined height difference.

In another embodiment of the invention, a narrow gap thin-film evaporative spray cooling system for cooling a plurality of electronic components utilizing a transversely sprayed cooling fluid is provided, comprising: a spray framework with a cooling fluid cavity which includes a cooling fluid inlet; the transverse spray framework defining an at least partial perimeter around a narrow gap cavity, the narrow gap cavity including a height, a width greater than the height, and a length, disposed to house a plurality of electronic components to be spray cooled; a plurality of transverse atomizers integral with the transverse spray framework at a spray side of the transverse spray framework, the plurality of transverse atomizers being disposed to receive cooling fluid, and further disposed to spray the cooling fluid toward the exit side into the narrow gap cavity transverse to the plurality of electronic components; a cooling fluid outlet in fluid communication with the cooling fluid cavity, the cooling fluid outlet being disposed to receive cooling fluid from the narrow gap cavity and route it to a transverse spray framework outlet; wherein impingement surfaces of the plurality of electronic components are in a staggered downstream position relative to each other such that the flow characteristics of the cooling fluid impacting upstream electronic components does not significantly affect the flow characteristics of the cooling fluid impacting downstream electronic components.

In a further embodiment of the invention, a narrow gap thin-film evaporative spray cooling system for cooling a plurality of electronic components utilizing a transversely sprayed cooling fluid is provided, comprising: a spray framework with a cooling fluid cavity which includes a cooling fluid inlet; the transverse spray framework defining an at least partial perimeter around a narrow gap cavity, the narrow gap cavity including a height, a width greater than the height, and a length, disposed to house a plurality of electronic components to be spray cooled; a plurality of transverse atomizers integral with the transverse spray framework at a spray side of the transverse spray framework, the plurality of transverse atomizers being disposed to receive cooling fluid, and further disposed to spray the cooling fluid toward the exit side into the narrow gap cavity transverse to the plurality of electronic components; a cooling fluid outlet in fluid communication with the cooling fluid cavity, the cooling fluid outlet being disposed to receive cooling fluid from the narrow gap cavity and route it to a transverse spray framework outlet; wherein the at least one electronic component has an impingement surface with a spray side and an exit side, the at least one electronic component being mounted such that the spray side of the impingement surface is mounted at a lower height than an exit side of the impingement surface, thereby creating a transverse impingement angle. A further embodiment of this is a narrow gap thin-film evaporative spray cooling system wherein there are a first and second electronic components with impingement surfaces, first electronic component being mounted nearer the spray side than the second electronic component, and further wherein the impingement surface of the first electronic component is at a lesser impingement angle than the impingement surface of the second electronic component.

In another embodiment of the invention, a method of designing a configuration of electronic components of a circuit card in narrow gap thin-film evaporative spray cooling system is provided, comprising the following: providing a circuit card for mounting a plurality of electronic components to be spray cooled in a narrow gap thin-film evaporative spray cooling system, the circuit card having a spray side and an exit side; and providing the plurality of electronic components each with an impingement surface; selectively mounting the plurality of electronic components on the circuit card such that the impingement surfaces of the electronic components toward the spray side are mounted at a height less than the impingement surfaces of the electronic components mounted toward the exit side of the circuit card by a pre-determined height difference.

In yet another embodiment of the invention as described in the preceding paragraph, a method of designing a configuration of electronic components of a circuit card in narrow gap thin-film evaporative spray cooling system as stated above, but further comprising selectively mounting the plurality of electronic components on the circuit card such that a spray side of the impingement surfaces of the electronic components are mounted at a lower height than an exit side of the electronic components.

In another method embodiment of the invention, a method of designing a configuration of electronic components of a circuit card in narrow gap thin-film evaporative spray cooling system is providing, comprising the following: providing a circuit card for mounting a plurality of electronic components to be spray cooled in a narrow gap thin-film evaporative spray cooling system, the circuit card having a spray side and an exit side; and providing the plurality of electronic components each with an impingement surface; selectively mounting the plurality of electronic components on the circuit card such that impingement surfaces of the plurality of electronic components are in a staggered downstream position relative to one other such that the flow characteristics of the cooling fluid impacting upstream electronic components do not significantly affect the flow characteristics of the cooling fluid impacting downstream electronic components. A further embodiment of the foregoing is a method of designing a configuration of electronic components of a circuit card in narrow gap thin-film evaporative spray cooling system as recited in claim 17, and further comprising: selectively mounting the plurality of electronic components on the circuit card such that a spray side of the impingement surfaces of the electronic components are mounted at a lower height than an exit side of the electronic components.

A still further embodiment of the invention is a method of designing a configuration of electronic components of a circuit card in narrow gap thin-film evaporative spray cooling system, comprising the following: providing a circuit card for mounting at least one electronic component to be spray cooled in a narrow gap thin-film evaporative spray cooling system, the circuit card having a spray side and an exit side; and providing the at least one electronic component each with an impingement surface; and selectively mounting the at least one electronic component on the circuit card such that a spray side of the impingement surfaces of the electronic components are mounted at a lower height than an exit side of the at least one electronic component.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A narrow gap thin-film evaporative spray cooling system for cooling at least one electronic component utilizing a transversely sprayed cooling fluid, comprising:
a transverse spray framework defining an at least partial perimeter around a narrow gap cavity, the narrow gap cavity including a height, a width greater than the height, and a length, disposed to house at least one electronic component to be spray cooled;
a plurality of transverse atomizers integral with the transverse spray framework at a first side of the transverse spray framework, the plurality of transverse atomizers being disposed to receive cooling fluid from a cooling fluid pre-heater and to spray the cooling fluid into the narrow gap cavity transverse to the at least one electronic component;
a cooling fluid outlet in fluid communication with the cooling fluid cavity, disposed to receive cooling fluid from the narrow gap cavity and route it to a transverse spray framework outlet; and
further wherein a cross-sectional area of the narrow gap cavity reduces from the atomizers to the cooling fluid outlet.

2. A narrow gap thin-film evaporative spray cooling system as recited in claim 1, and further wherein the plurality of atomizers are configured to spray the cooling fluid into the narrow gap cavity in a spray pattern which includes a first spray pattern angle corresponding to the width of the narrow gap cavity and a second spray pattern angle corresponding to the height of the narrow gap cavity, and further wherein the first spray pattern angle has a predetermined approximate magnitude greater than the second spray angle dimension.

3. The narrow gap thin-film evaporative spray cooling system as recited in claim 1, and further wherein the cooling fluid vapor recirculation system comprises two or more cooling fluid vapor recirculation inlets each configured to receive cooling fluid vapor routed through the cooling fluid vapor outlet and disposed to direct said cooling fluid vapor through the narrow gap cavity in the approximate direction of transverse flow of the cooling fluid.

4. The narrow gap thin-film evaporative spray cooling system as recited in claim 3, and further wherein each of the two or more cooling fluid vapor recirculation inlets are disposed to direct said cooling fluid vapor at a pre-determined introduction angle, and further wherein the pre-determined introduction angles are dissimilar to one another.

5. The narrow gap thin-film evaporative spray cooling system as recited in claim 1, and further wherein at least one of the plurality of transverse atomizers is oriented at a first angle and at least one of the plurality of transverse atomizers is oriented at a second angle relative to the circuit card.

6. A narrow gap thin-film evaporative spray cooling system for cooling at least one electronic component utilizing a transversely sprayed cooling fluid, comprising:
a transverse spray framework defining an at least partial perimeter around a narrow gap cavity, the narrow gap cavity including a height, a width greater than the height, and a length, disposed to house at least one electronic component to be spray cooled;
a plurality of transverse atomizers integral with the transverse spray framework at a first side of the transverse spray framework, the plurality of transverse atomizers being disposed to receive cooling fluid and to spray the cooling fluid into the narrow gap cavity transverse to the at least one electronic component;
a cooling fluid outlet in fluid communication with the cooling fluid cavity, disposed to receive cooling fluid from the narrow gap cavity and route it to a transverse spray framework outlet;
a cooling fluid vapor recirculation system which comprises:
a cooling fluid vapor outlet at the downstream side of the narrow gap cavity, the cooling fluid outlet configured to receive cooling fluid vapor from the narrow gap cavity; and
a cooling fluid vapor recirculation inlet configured to receive cooling fluid vapor routed through the cooling fluid vapor outlet and disposed to direct said cooling fluid vapor through the narrow gap cavity in the approximate direction of transverse flow of the cooling fluid.

7. A narrow gap thin-film evaporative spray cooling system for cooling at least one electronic component utilizing a transversely sprayed cooling fluid, comprising:
a transverse spray framework defining an at least partial perimeter around a narrow gap cavity, the narrow gap cavity including a height, a width greater than the height, and a length, disposed to house at least one electronic component to be spray cooled;
a plurality of transverse atomizers integral with the transverse spray framework at a first side of the transverse spray framework, the plurality of transverse atomizers being disposed to receive cooling fluid and to spray the cooling fluid into the narrow gap cavity transverse to the at least one electronic component;
a cooling fluid outlet in fluid communication with the cooling fluid cavity, disposed to receive cooling fluid from the narrow gap cavity and route it to a transverse spray framework outlet; and further wherein a cross-sectional area of the narrow gap cavity reduces from the atomizers to the cooling fluid outlet by at least twenty percent.

8. A narrow gap thin-film evaporative spray cooling system for cooling at least one electronic component utilizing a transversely sprayed cooling fluid, comprising:

a transverse spray framework defining an at least partial perimeter around a narrow gap cavity, the narrow gap cavity including a height, a width greater than the height, and a length, disposed to house at least one electronic component to be spray cooled;

a plurality of transverse atomizers integral with the transverse spray framework at a first side of the transverse spray framework, the plurality of transverse atomizers being disposed to receive cooling fluid and to spray the cooling fluid into the narrow gap cavity transverse to the at least one electronic component;

a cooling fluid outlet in fluid communication with the cooling fluid cavity, disposed to receive cooling fluid from the narrow gap cavity and route it to a transverse spray framework outlet; and further wherein a cross-sectional area of the narrow gap cavity reduces from the atomizers to the cooling fluid outlet by at least forty percent.

9. A narrow gap thin-film evaporative spray cooling system for cooling a plurality of electronic components utilizing a transversely sprayed cooling fluid, comprising:

a spray framework with a cooling fluid cavity which includes a cooling fluid inlet;

the transverse spray framework defining an at least partial perimeter around a narrow gap cavity, the narrow gap cavity including a height, a width greater than the height, and a length, disposed to house a plurality of electronic components to be spray cooled;

a plurality of transverse atomizers integral with the transverse spray framework at a spray side of the transverse spray framework, the plurality of transverse atomizers being disposed to receive cooling fluid from a cooling fluid preheater, and further disposed to spray the cooling fluid toward the exit side into the narrow gap cavity transverse to the plurality of electronic components;

a cooling fluid outlet in fluid communication with the cooling fluid cavity, the cooling fluid outlet being disposed to receive cooling fluid from the narrow gap cavity and route it to a transverse spray framework outlet; and wherein the plurality of electronic components have an impingement surface with a spray side and an exit side, the plurality of electronic components being mounted such that the spray side of the impingement surface is mounted at a lower height than an exit side of the impingement surface, thereby creating a transverse impingement angle.

10. A narrow gap thin-film evaporative spray cooling system for cooling a plurality of electronic components utilizing a transversely sprayed cooling fluid, comprising:

a spray framework with a cooling fluid cavity which includes a cooling fluid inlet;

the transverse spray framework defining an at least partial perimeter around a narrow gap cavity, the narrow gap cavity including a height, a width greater than the height, and a length, disposed to house a plurality of electronic components to be spray cooled;

a plurality of transverse atomizers integral with the transverse spray framework at a spray side of the transverse spray framework, the plurality of transverse atomizers being disposed to receive cooling fluid from a cooling fluid preheater, and further disposed to spray the cooling fluid toward the exit side into the narrow gap cavity transverse to the plurality of electronic components;

a cooling fluid outlet in fluid communication with the cooling fluid cavity, the cooling fluid outlet being disposed to receive cooling fluid from the narrow gap cavity and route it to a transverse spray framework outlet; and wherein impingement surfaces of the plurality of electronic components are in a staggered downstream position relative to each other such that the flow characteristics of the cooling fluid impacting upstream electronic components does not significantly affect the flow characteristics of the cooling fluid impacting downstream electronic components.

11. A narrow gap thin-film evaporative spray cooling system for cooling a plurality of electronic components utilizing a transversely sprayed cooling fluid, comprising:

a spray framework with a cooling fluid cavity which includes a cooling fluid inlet;

the transverse spray framework defining an at least partial perimeter around a narrow gap cavity, the narrow gap cavity including a height, a width greater than the height, and a length, disposed to house a plurality of electronic components to be spray cooled;

a plurality of transverse atomizers integral with the transverse spray framework at a spray side of the transverse spray framework, the plurality of transverse atomizers being disposed to receive cooling fluid from a cooling fluid preheater, and further disposed to spray the cooling fluid toward the exit side into the narrow gap cavity transverse to the plurality of electronic components;

a cooling fluid outlet in fluid communication with the cooling fluid cavity, the cooling fluid outlet being disposed to receive cooling fluid from the narrow gap cavity and route it to a transverse spray framework outlet; and wherein the at least one electronic component has an impingement surface with a spray side and an exit side, the at least one electronic component being mounted such that the spray side of the impingement surface is mounted at a lower height than an exit side of the impingement surface, thereby creating a transverse impingement angle.

12. A narrow gap thin-film, evaporative spray cooling system as provided in claim 11, and wherein there are a first and second electronic components with impingement surfaces, first electronic component being mounted nearer the spray side than the second electronic component, and further wherein the impingement surface of the first electronic component is at a lesser impingement angle than the impingement surface of the second electronic component.

\* \* \* \* \*